US006924519B2

United States Patent
Itokawa et al.

(10) Patent No.: US 6,924,519 B2
(45) Date of Patent: Aug. 2, 2005

(54) SEMICONDUCTOR DEVICE WITH PEROVSKITE CAPACITOR

(75) Inventors: Hiroshi Itokawa, Yokohama (JP); Koji Yamakawa, Tokyo (JP); Keitaro Imai, Yokohama (JP); Katsuaki Natori, Yokohama (JP); Bum-ki Moon, Tokyo (JP)

(73) Assignees: Kabushiki Kaisha Toshiba, Tokyo (JP); Infineon Technologies, AG, Munich (DE)

( * ) Notice: Subject to any disclaimer, the term of this patent is extended or adjusted under 35 U.S.C. 154(b) by 177 days.

(21) Appl. No.: 10/427,962

(22) Filed: May 2, 2003

(65) Prior Publication Data
US 2004/0217404 A1 Nov. 4, 2004

(51) Int. Cl.[7] .................... H01L 29/76; H01L 29/94; H01L 31/062; H01L 31/113; H01L 31/119
(52) U.S. Cl. ............... 257/295; 257/296; 257/301; 257/303; 257/306; 257/310
(58) Field of Search .................. 257/295–310

(56) References Cited

U.S. PATENT DOCUMENTS 6,372,598 B2 * 4/2002 Kang et al. ............... 438/399

6,602,543 B2 * 8/2003 Yadav et al. ............. 427/126.1

FOREIGN PATENT DOCUMENTS

JP 2000-208725 7/2000
JP 2000-260954 9/2000

* cited by examiner

Primary Examiner—Jerome Jackson
Assistant Examiner—Jesse A. Fenty
(74) Attorney, Agent, or Firm—Oblon, Spivak, McClelland, Maier & Neustadt, P.C.

(57) ABSTRACT

There is disclosed a semiconductor device comprising a semiconductor substrate, and a capacitor provided above the semiconductor substrate and comprising a bottom electrode, a top electrode, and a dielectric film provided between the bottom electrode and the top electrode, at least one of the bottom electrode and the top electrode comprising a conductive film selected from a noble metal film and a noble metal oxide film, a metal oxide film having a perovskite structure, provided between the dielectric film and the conductive film, represented by $ABO_3$, and containing a first metal element as a B site element, and a metal film provided between the conductive film and the metal oxide film, and containing a second metal element which is a B site element of a metal oxide having a perovskite structure, a decrease of Gibbs free energy at a time when the second metal element forms an oxide being larger than that at a time when the first metal element forms an oxide.

22 Claims, 6 Drawing Sheets

| A site element | | B site element (quadrivalent) | | B site element (tervalent) | |
|---|---|---|---|---|---|
| Oxide | $-\Delta H$[kcal/mol] | Oxide | $-\Delta H$[kcal/mol] | Oxide | $-\Delta H$[kcal/mol] |
| $La_2O_3$ | -285.7 | $TiO_2$ | -225.8 | $Ti_2O_3$ | -242.3 |
| SrO | -283.0 | $NbO_3$ | -190 | $V_2O_3$ | -194.2 |
| BaO | -264.6 | $VO_2$ | -170.5 | $Cr_2O_3$ | -180.0 |
| | | $MoO_2$ | -140.5 | $Mn_2O_3$ | -152.5 |
| | | $CrO_2$ | -139.2 | $Ni_2O_3$ | -77.4 |
| | | $Co_3O_4$ | -106.0 | | |
| | | $RuO_2$ | -72.8 | | |
| | | $IrO_2$ | -57.7 | | |

FIG. 8

SEMICONDUCTOR DEVICE WITH PEROVSKITE CAPACITOR

BACKGROUND OF THE INVENTION

1. Field of the Invention

The present invention relates to a semiconductor device, particularly to a semiconductor device having a capacitor.

2. Description of the Related Art

In recent years, development of a ferroelectric memory (FeRAM: Ferroelectric Random Access Memory) in which a ferroelectric film is used as a dielectric film of a capacitor has been advanced.

Examples of a typical ferroelectric film for use in the ferroelectric memory include a Pb(Zr$_x$Ti$_{1-x}$)O$_3$ film (PZT film) and SrBi$_2$Ta$_2$O$_9$ film (SBT film). PZT is a perovskite compound, and SBT is a Bi aurivillius phase compound having a pseudo perovskite structure.

When the PZT film is used as the ferroelectric film, conductive perovskite metal oxide films such as an SrRuO$_3$ film (SRO film) are used for an electrode from a viewpoint of improvement of a fatigue characteristic. For example, in Jpn. Pat. Appln. KOKAI Publication Nos. 2000-208725 and 2000-260954, a ferroelectric capacitor is described in which a stacked film of SRO and Pt films is used for the electrode.

On the other hand, in recent years, a ferroelectric memory having a capacitor-on-plug (COP) structure has been developed. Since a plug connected to a transistor is disposed right under the capacitor in the COP structure, it is possible to prepare a ferroelectric memory with a higher density. With the use of the COP structure, there is a fear of oxidation of the plug at a heat treatment under an oxygen atmosphere essential for preparing the ferroelectric capacitor. Therefore, it is necessary to use noble metal films, such as Ir film, which have good barrier properties, for the electrode.

Here, it is assumed that the stacked structure of SRO and Ir films is used for the electrode in the COP structure. In this case, Ir reacts with Sr included in the SRO film by the heat treatment, and a problem occurs that crystallinity of the SRO film remarkably drops. As a result, characteristics and reliability of the capacitor are remarkably deteriorated. This problem is generally caused in a combination of the conductive perovskite metal oxide film and noble metal film (or noble metal oxide film).

When the stacked structure of the conductive perovskite metal oxide film and noble metal film (or noble metal oxide film) is used for the electrode of the capacitor in this manner, there is a problem that the characteristics and reliability of the capacitor are remarkably deteriorated.

BRIEF SUMMARY OF THE INVENTION

According to a first aspect of the present invention, there is provided a semiconductor device comprising: a semiconductor substrate; and a capacitor provided above the semiconductor substrate and comprising a bottom electrode, a top electrode, and a dielectric film provided between the bottom electrode and the top electrode, at least one of the bottom electrode and the top electrode comprising: a conductive film selected from a noble metal film and a noble metal oxide film; a metal oxide film having a perovskite structure, provided between the dielectric film and the conductive film, represented by ABO$_3$, and containing a first metal element as a B site element; and a metal film provided between the conductive film and the metal oxide film, and containing a second metal element which is a B site element of a metal oxide having a perovskite structure, a decrease of Gibbs free energy at a time when the second metal element forms an oxide being larger than that at a time when the first metal element forms an oxide.

According to a second aspect of the present invention, there is provided a semiconductor device comprising: a semiconductor substrate; and a capacitor provided above the semiconductor substrate and comprising a bottom electrode, a top electrode, and a dielectric film provided between the bottom electrode and the top electrode, at least one of the bottom electrode and the top electrode comprising: a conductive film selected from a noble metal film and a noble metal oxide film; and a metal oxide film having a perovskite structure, provided between the dielectric film and the conductive film, represented by ABO$_3$, and containing first and second metal elements as B site elements; a decrease of Gibbs free energy at a time when the second metal element forms an oxide being larger than that at a time when the first metal element forms an oxide.

BRIEF DESCRIPTION OF THE SEVERAL VIEWS OF THE DRAWING

FIG. 8 is a diagram showing generation enthalpy of an oxide; and

DETAILED DESCRIPTION OF THE INVENTION

Embodiments of the present invention will be described hereinafter with reference to the drawings.

First Embodiment

Figure 1A:
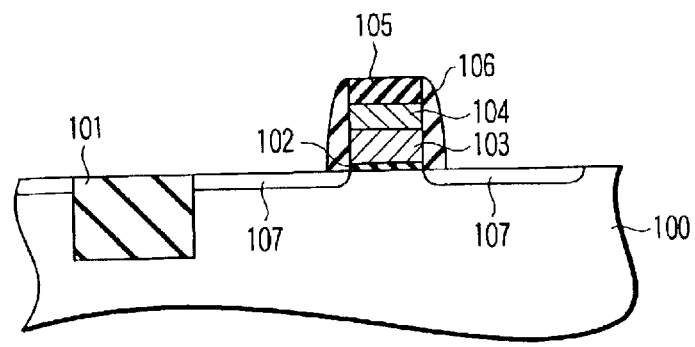
FIGS. 1A to 1C are sectional views of manufacturing steps of a semiconductor device according to a first embodiment of the present invention.
Figure 1B:
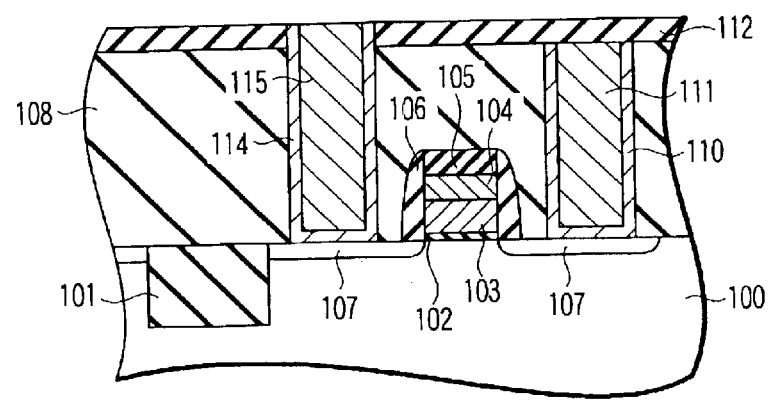
Figure 1C:
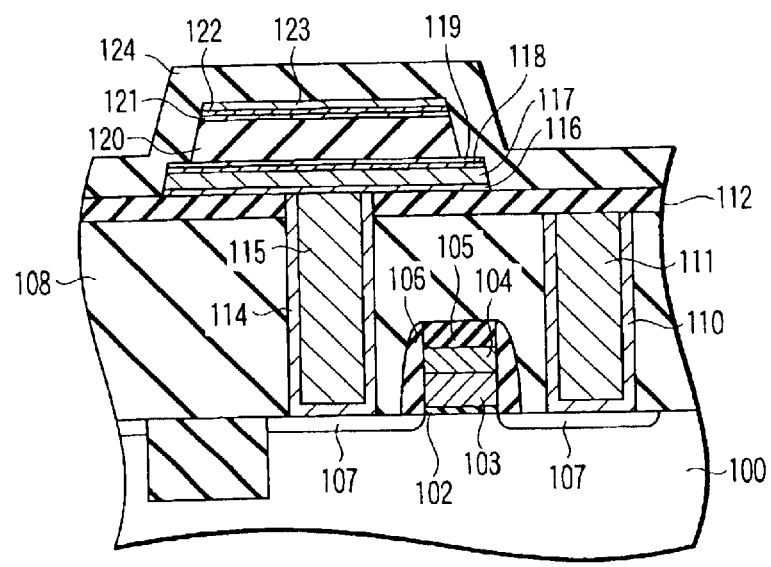

FIGS. 1A to 1C are sectional views showing manufacturing steps of a semiconductor device according to a first embodiment of the present invention.

First, as shown in FIG. 1A, an isolation region 101 of a shallow trench isolation (STI) structure is formed on a p-type silicon substrate (semiconductor substrate) 100. Subsequently, an MIS transistor is formed as follows.

First, a silicon oxide film having a thickness of about 6 nm is formed as a gate insulating film 102 by thermal oxidation. Subsequently, an n$^+$-type polysilicon film 103 doped with arsenic is formed on the gate insulating film 102. Furthermore, a WSi$_x$ film 104 and silicon nitride film 105 are formed on the polysilicon film 103. Thereafter, the polysilicon film 103, WSi$_x$ film 104, and silicon nitride film 105 are processed by a usual photolithography process and RIE process to form a gate electrode. Subsequently, a silicon nitride film 106 is deposited on the whole surface. Furthermore, RIE is performed to form a sidewall spacer made of the silicon nitride film 106 on a side wall of the gate electrode. A detailed description is omitted, but source/drain regions 107 are formed by ion implantation and heat treatment in the present step.

Next, as shown in FIG. 1B, a silicon oxide film 108 is deposited on the whole surface by a chemical vapor deposition (CVD) process, and further a flattening process is performed by a CMP process. Subsequently, a contact hole reaching one of the source/drain regions 107 is formed in the silicon oxide film 108. Thereafter, a titanium film is deposited by a sputtering or CVD process. Subsequently, the titanium film is nitrided by heat treatment in a forming gas to form a TiN film 110. Furthermore, a tungsten film 111 is deposited by a CVD process. Subsequently, the TiN film 110 and tungsten film 111 outside the contact hole are removed by a CMP process, and the TiN film 110 and tungsten film 111 are left in the contact hole. Thereby, a plug connected to one of the source/drain regions 107 is formed. Thereafter, a silicon nitride film 112 is deposited on the whole surface by the CVD process. Furthermore, a contact hole reaching the other source/drain region 107 is formed. Subsequently, by a method similar to the above-described method, a TiN film 114 and tungsten film 115 are formed in the contact hole. Thereby, a plug connected to the other source/drain region 107 is formed.

Next, as shown in FIG. 1C, a titanium film 116 having a thickness of 10 nm, an iridium film 117 having a thickness of 100 nm, which is a noble metal film, a titanium film 118 having a thickness of 2.5 nm, which is a metal film, and an SrRuO$_3$ film (SRO film) 119 having a thickness of 10 nm, which is a conductive perovskite metal oxide film, are successively deposited by a sputtering process. Subsequently, the SRO film 119 is crystallized by rapid thermal annealing (RTA) in an oxygen atmosphere. Thereafter, a Pb(Zr$_x$Ti$_{1-x}$)O$_3$ film (PZT film) 120, which is the dielectric film of the capacitor, is formed by a sputtering process. Furthermore, the PZT film 120 is crystallized by RTA in an oxygen atmosphere. Subsequently, an SRO film 121 having a thickness of 10 nm, which is a conductive perovskite metal oxide film, is deposited by a sputtering process. Furthermore, the SRO film 121 is crystallized by RTA in an oxygen atmosphere. It is to be noted that the SRO film 121 is deposited, for example, at a temperature of 500° C., and thereby the SRO film 121 superior in crystallinity can be easily formed. Subsequently, a titanium film 122 having a thickness of 2.5 nm, which is a metal film, and an iridium film 123 having a thickness of 100 nm, which is a noble metal film, are successively deposited by a sputtering process.

Next, a silicon oxide film (not shown) is deposited on the whole surface by a CVD process. Furthermore, the silicon oxide film is patterned by a photolithography process and RIE process. Subsequently, the patterned silicon oxide film is used as a mask to etch the iridium film 123, titanium film 122, SRO film 121, and PZT film 120 by an RIE process. Furthermore, the SRO film 119, titanium film 118, iridium film 117, and titanium film 116 are patterned by photolithography and RIE processes.

In this manner, a ferroelectric capacitor is formed comprising: a bottom electrode having a stacked structure of the titanium film 116, iridium film 117, titanium film 118, and SRO film 119; a ferroelectric film (PZT film 120); and a top electrode having a stacked structure of the SRO film 121, titanium film 122, and iridium film 123.

Thereafter, a silicon oxide film 124 is deposited on the whole surface by the CVD process. Furthermore, heat treatment is performed at about 650° C. under the oxygen atmosphere in order to remedy a damage generated in the PZT film 120 at the etching process. In this heat treatment, oxygen flows through the PZT film 120, but the oxygen barrier function of the iridium film 117 prevents the tungsten plug 115 from being oxidized.

The subsequent steps (not shown) comprise: forming a contact portion connected to the tungsten film 111; forming drive and bit lines; and forming metal wirings, to complete the ferroelectric memory which includes the COP structure.

It is to be noted that, in the above-described embodiment, the structure of the titanium film disposed between the SRO and iridium films is used in both the bottom and top electrodes, but could also be used in one of the bottom and top electrodes. For example, the structure may be used in the bottom electrode, whereas the stacked structure of SRO and platinum films may also be used in the top electrode.

A characteristic enhancing effect of the ferroelectric capacitor according to the present embodiment will be described hereinafter with reference to FIGS. 2 to 7.

Figure 2:
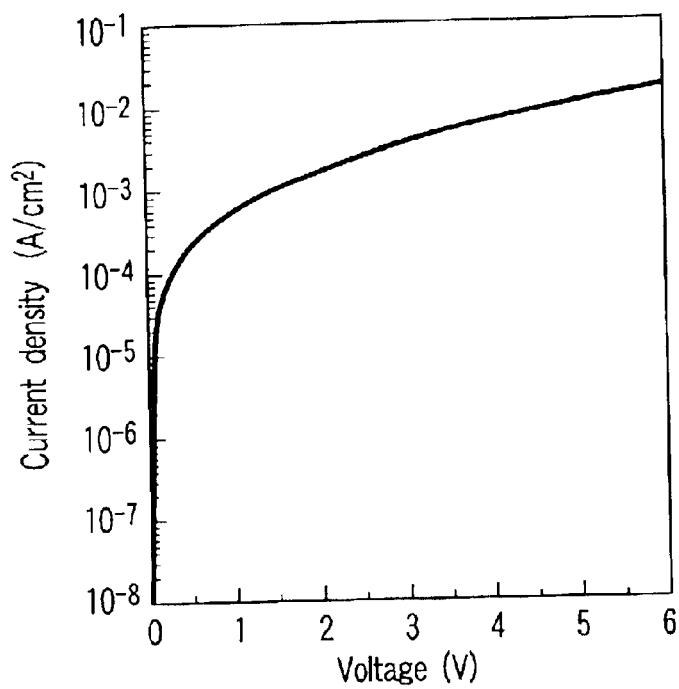
FIG. 2 is a diagram showing a leak current characteristic according to a comparative example of the first embodiment of the present invention.

In a comparative example of the present embodiment, a sample was prepared in which an SiO$_2$ film, titanium film (thickness of 10 nm), iridium film (120 nm), SRO film (10 nm), PZT film, and platinum film (50 nm) were successively formed on a silicon substrate. For the SRO and PZT films, after forming an amorphous film by sputtering, the film was annealed and crystallized in an oxygen atmosphere. FIG. 2 shows the leak current characteristic of the sample obtained in this manner. The leak current characteristic is remarkably deteriorated as compared with the sample of the present embodiment described later.

Figure 3:
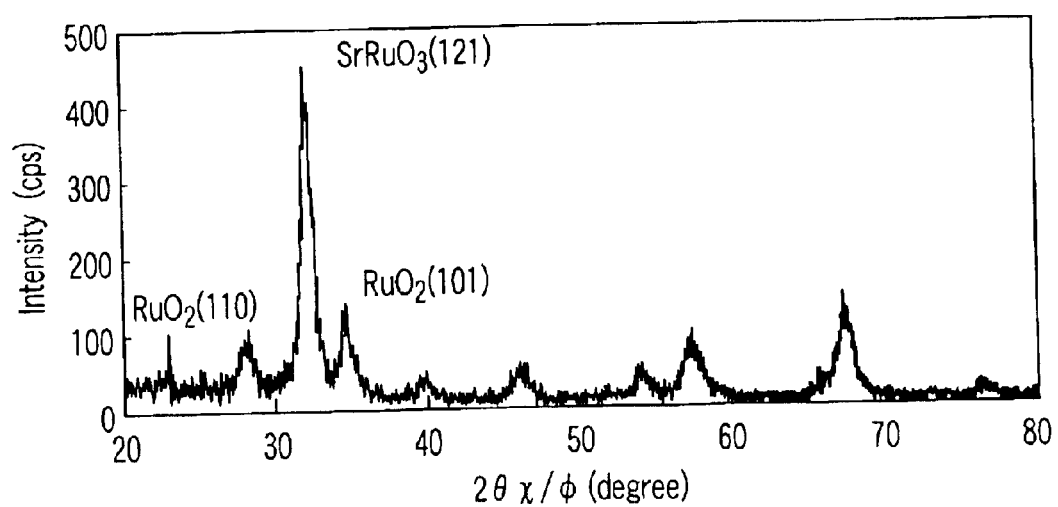
FIG. 3 is a diagram showing a result of in-plane diffraction according to a comparative example of the first embodiment of the present invention.

Moreover, in the comparative example, a sample was prepared in which the SiO$_2$ film, titanium film (thickness of 10 nm), iridium film (120 nm), and SRO film (10 nm) were successively formed on the silicon substrate. For the SRO film, after forming the amorphous film by a sputtering, the film was annealed and crystallized in an oxygen atmosphere. FIG. 3 shows the results of in-plane diffraction of the sample obtained in this manner. A diffraction peak of SrRuO$_3$ (121) is observed in the vicinity of 2θ/θ=32 degrees. Furthermore, a diffraction peak of RuO$_2$ (110) is observed in the vicinity of 2θ/θ=28 degrees, and a diffraction peak of RuO$_2$ (101) is observed in the vicinity of 2θ/θ=32 degrees.

The deterioration of the leak current characteristic of FIG. 2 is believed to be caused by the RuO$_2$. That is, in the sample of FIG. 2, the amorphous PZT film is formed on the SRO film which contains RuO$_2$ and which is low in crystallinity, and is crystallized. Therefore, Pb reacts with RuO$_2$ at an interface between the PZT and SRO films and at grain boundary of PZT, and conductive compounds such as Pb$_2$Ru$_2$O$_{7-x}$ are formed. This conductive compound forms a leak path, and thus the leak current increases.

Figure 4:
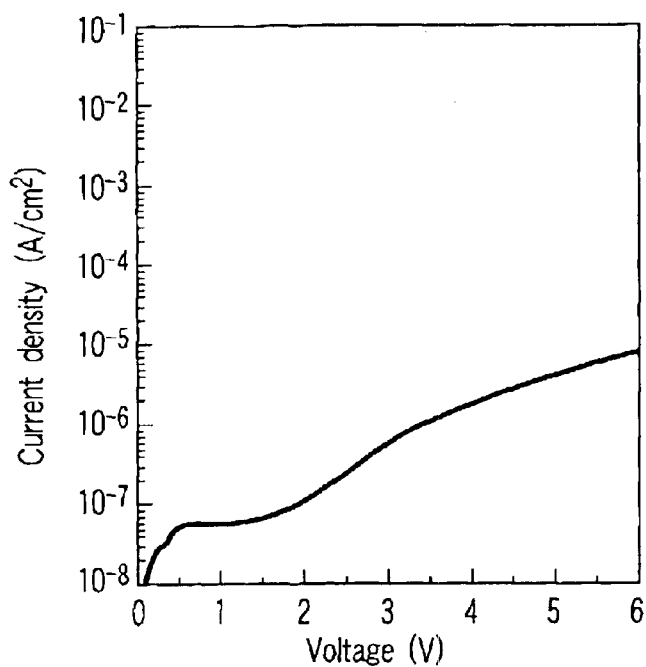
FIG. 4 is a diagram showing the leak current characteristic according to the first embodiment of the present invention.

On the other hand, in the sample of the present embodiment, the SiO$_2$ film, titanium film (thickness of 10 nm), iridium film (120 nm), titanium film (2.5 nm), SRO film (10 nm), PZT film, and platinum film (50 nm) were successively formed on the silicon substrate. For the SRO and PZT films, after forming the amorphous film by sputtering, the film was annealed and crystallized in an oxygen atmosphere. FIG. 4 shows the leak current characteristic of the sample obtained in this manner. The leak current characteristic is remarkably improved as compared with the sample of the comparative example.

Figure 5:
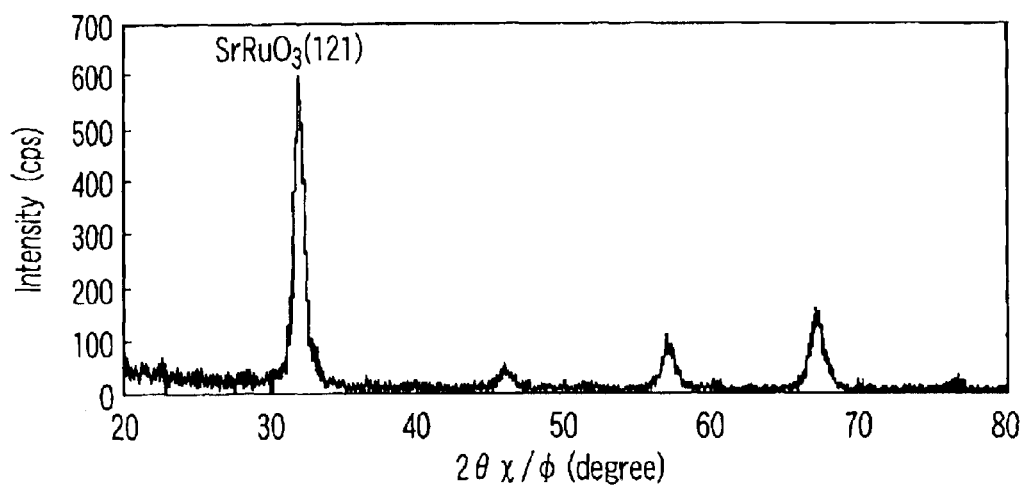
FIG. 5 is a diagram showing the result of in-plane diffraction according to the first embodiment of the present invention.

Moreover, for the present embodiment, a sample was prepared in which the $SiO_2$ film, titanium film (thickness of 10 nm), iridium film (120 nm), titanium film (2.5 nm), and SRO film (10 nm) were successively formed on the silicon substrate. For the SRO film, after forming the amorphous film by sputtering, the film was annealed and crystallized in an oxygen atmosphere. FIG. 5 shows the results of in-plane diffraction of the sample obtained in this manner. As seen from FIG. 5, the diffraction peak of $RuO_2$ as in FIG. 3 is not observed. Therefore, in the present embodiment, the SRO film extremely superior in crystallinity is obtained.

Figure 6:
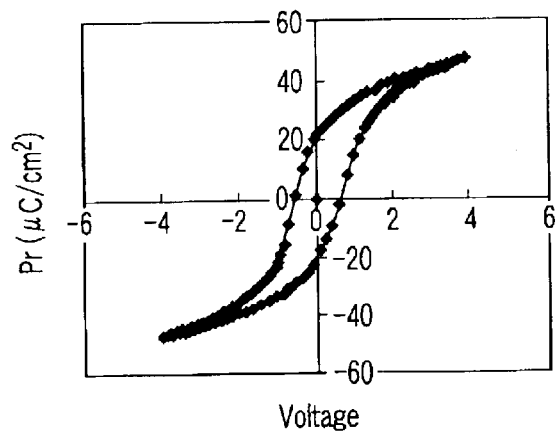
FIG. 6 is a diagram showing a hysteresis characteristic according to the first embodiment of the present invention.
Figure 7:
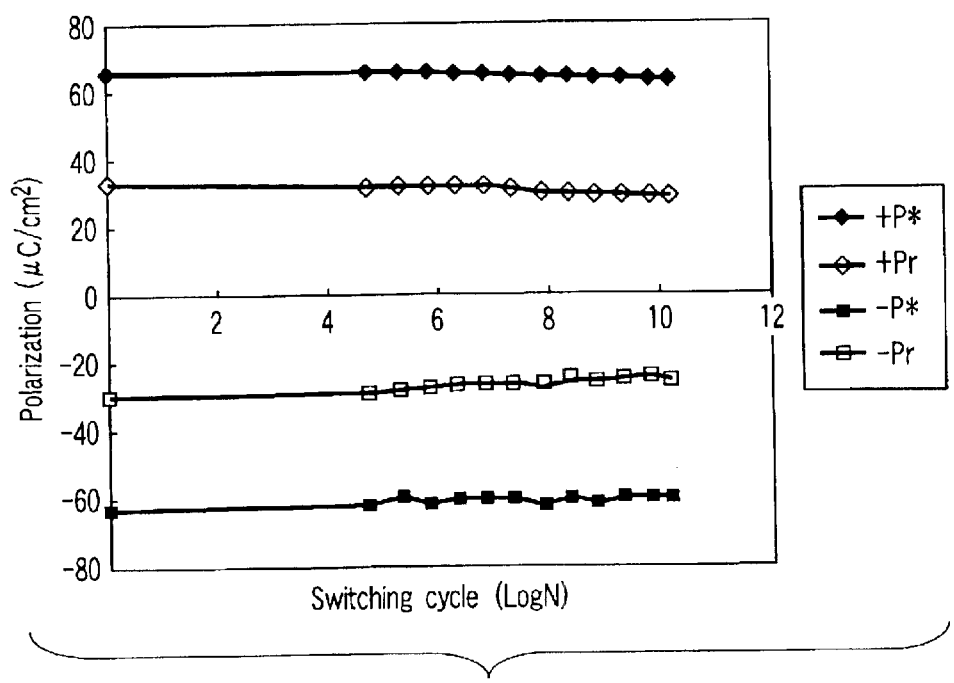
FIG. 7 is a diagram showing a fatigue characteristic according to the first embodiment of the present invention.

FIG. 6 shows a hysteresis characteristic in the sample of the present embodiment. FIG. 7 shows a fatigue characteristic in the sample of the present embodiment. As seen from FIGS. 6 and 7, both the hysteresis and fatigue characteristics were highly satisfactory.

When the titanium film is disposed between the SRO and iridium films in this manner, the characteristics of the capacitor can be enhanced. This characteristic enhancing effect will be described hereinafter in more detail.

From ab initio calculations of the generation free energy of the conductive perovskite metal oxide, it is seen that thermodynamic stability of the conductive perovskite metal oxide (represented by a general formula $ABO_3$) is proportional to that of the oxide of a B site element ($BO_x$). Moreover, A site elements, such as an alkaline-earth element and rare earth element, form extremely stable oxides. Therefore, it may be considered that the stability of the conductive perovskite metal oxide is determined by that of the oxide of the B site element.

FIG. 8 shows a generation enthalpy per oxygen molecule of a simple oxide at 25° C. with respect to various metal elements. A larger absolute value of a numeric value shown in FIG. 8 indicates a higher stability of the oxide. That is, a high absolute numeric value shown in FIG. 8 indicates a large decrease amount of Gibbs free energy at a time when the metal element forms the oxide.

As seen from FIG. 8, Ru, which is the B site element of SRO, indicates −72.8 (kcal/mol), and Ti indicates −225.8 (kcal/mol). That is, a Ti oxide is higher in stability than an Ru oxide. As described above, it is seen that the thermodynamic stability of the conductive perovskite metal oxide is proportional to that of the oxide of the B site element. Therefore, when at least a part of Ru atoms contained in SRO is replaced with Ti atoms, the stability of SRO increases.

In the present embodiment, the titanium film is provided between the SRO and iridium films. Therefore, it is considered that a part of Ru included in the SRO film is replaced with Ti by the heat treatment. When Ti is contained, the stability of the SRO film is enhanced. Therefore, the conductive compounds such as $RuO_2$ are inhibited from being generated. As a result, it is considered that the characteristics of the capacitor are enhanced.

As described above, since the titanium film is provided between the SRO and iridium films in the present embodiment, the stability of the SRO film and the characteristics of the capacitor can be enhanced. Moreover, when this structure is used for the bottom electrode, the oxidation of the tungsten plug can be inhibited by the barrier function of the iridium film. Therefore, even when the COP structure is used, it is possible to obtain a ferroelectric memory of superior characteristics and reliability.

Second Embodiment

Figure 9A:
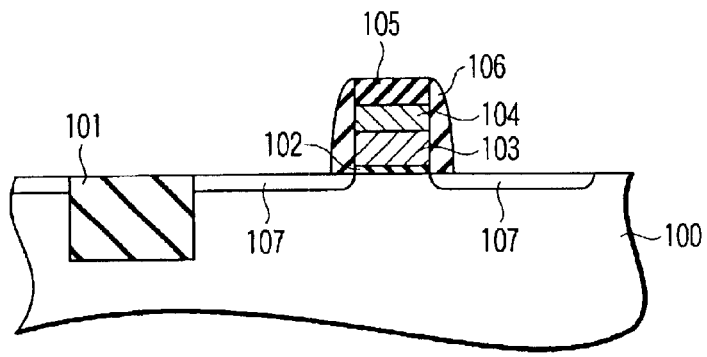
FIGS. 9A to 9C are sectional views showing the manufacturing steps of the semiconductor device according to a second embodiment of the present invention.
Figure 9B:
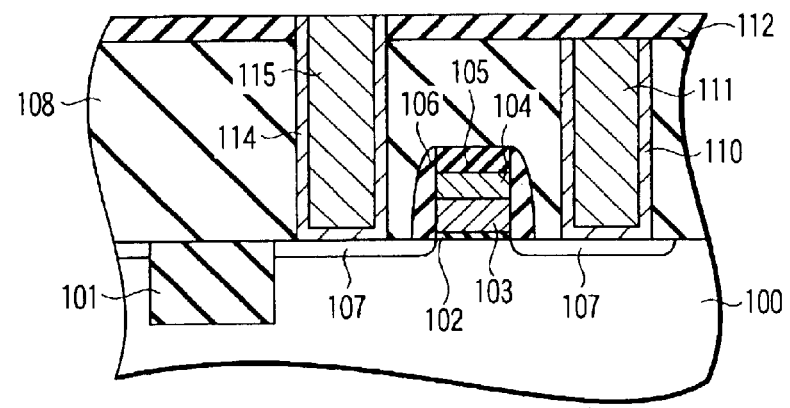
Figure 9C:
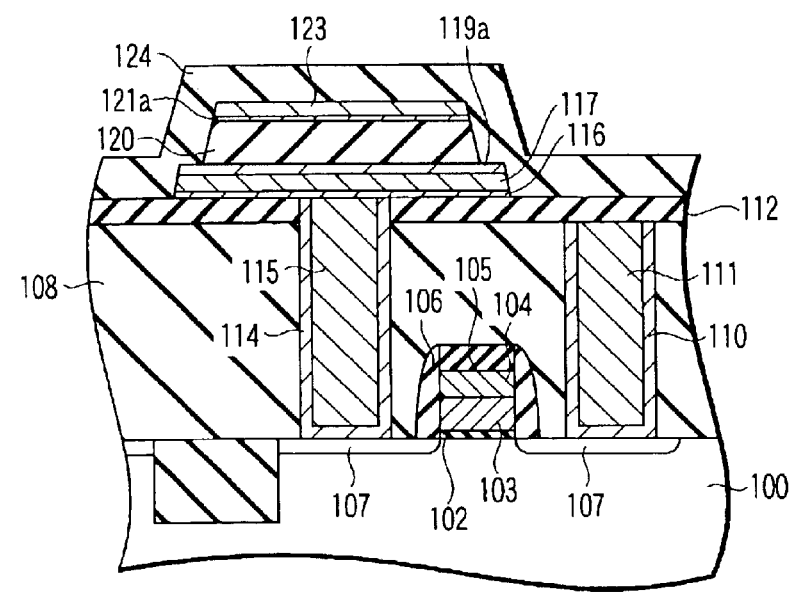

FIGS. 9A to 9C are sectional views showing the manufacturing steps of the semiconductor device according to a second embodiment of the present invention.

The steps of FIGS. 9A and 9B are substantially similar to those of FIGS. 1A and 1B of the first embodiment, and the description thereof is omitted.

After the step of FIG. 9B, as shown in FIG. 9C, the titanium film 116 having a thickness of 10 nm, and the iridium film 117 having a thickness of 100 nm, which is the noble metal film, are successively deposited by a sputtering process. Subsequently, an SRO film ($Sr(Ru,Ti)O_3$ film) 119a doped with titanium, which is the conductive perovskite metal oxide film, having a thickness of 10 nm, is deposited by a sputtering process. Subsequently, the SRO film 119a doped with titanium is crystallized by RTA in an oxygen atmosphere. Thereafter, the $Pb(Zr_xTi_{1-x})O_3$ film (PZT film) 120, which is the dielectric film of the capacitor, is formed by a sputtering process. Furthermore, the PZT film 120 is crystallized by RTA in an oxygen atmosphere. Subsequently, an SRO film ($Sr(Ru,Ti)O_3$ film) 121a doped with titanium, which is the conductive perovskite metal oxide film, having a thickness of 10 nm, is deposited by a sputtering process. Furthermore, the SRO film 121a doped with titanium is crystallized by RTA in an oxygen atmosphere. Subsequently, the iridium film 123 having a thickness of 100 nm, which is a noble metal film, is deposited by a sputtering process.

Next, a silicon oxide film (not shown) is deposited on the whole surface by a CVD process. Furthermore, the silicon oxide film is patterned by photolithography and RIE processes. Subsequently, the patterned silicon oxide film is used as a mask to etch the iridium film 123, SRO film 121a, and PZT film 120 by an RIE process. Furthermore, the SRO film 119a, iridium film 117, and titanium film 116 are patterned by photolithography and RIE processes.

In this manner, the ferroelectric capacitor is formed comprising: the bottom electrode having the stacked structure of the titanium film 116, iridium film 117, and SRO film 119a; the ferroelectric film (PZT film 120); and the top electrode having the stacked structure of the SRO film 121a, and iridium film 123.

Thereafter, the silicon oxide film 124 is deposited on the whole surface by a CVD process. Furthermore, a heat treatment is performed at about 650° C. under an oxygen atmosphere, in order to remedy the damage generated in the PZT film 120 by the etching process. In this heat treatment, oxygen flows through the PZT film 120, but the oxygen barrier function of the iridium film 117 prevents the tungsten plug 115 from being oxidized.

The subsequent steps (not shown) comprise: forming a contact portion connected to the tungsten film 111; forming the drive and bit lines; and forming the metal wirings to complete the ferroelectric memory which includes the COP structure.

It is to be noted that, in the above-described embodiment, the stacked structure of the SRO film doped with titanium and the iridium film is used in both the bottom and top electrodes, but could also be used in one of the bottom and top electrodes. For example, the structure may be used for the bottom electrode, whereas the stacked structure of the SRO film not doped with titanium and the platinum film may also be used for the top electrode.

As described above, in the present embodiment, the stacked structure of the SRO film doped with titanium and the iridium film is used. Therefore, as described in the first embodiment, the stability of the SRO film and the characteristics of the capacitor can be enhanced. Moreover, when this stacked structure is used for the bottom electrode, the oxidation of the tungsten plug can be inhibited by the barrier function of the iridium film. Therefore, even when the COP structure is used, it is possible to obtain the ferroelectric memory of superior characteristics and reliability.

It is to be noted that the above-described first and second embodiments can variously be modified as follows.

In the first and second embodiments, an SRO film (SrRuO$_3$ film) is used as the conductive perovskite metal oxide film. However, an (La,Sr)CoO$_3$ film, BaRuO$_3$ film, or LaNiO$_3$ film may also be used. In general, it is possible to use a conductive perovskite metal oxide film which contains at least one of Ru, Co, and Ni as the B site element.

Moreover, the iridium film (Ir film) is used as a noble metal film (conductive film) in the first and second embodiments, but a ruthenium film (Ru film) or platinum film (Pt film) may also be used. Furthermore, instead of the noble metal film, noble metal oxide films, such as an iridium oxide film (IrO$_2$ film) or ruthenium oxide film (RuO$_2$ film), may also be used.

Additionally, a titanium film (Ti film) is used as the metal film in the first embodiment, and an SRO film doped with titanium (Ti) is used in the second embodiment, but metal elements other than Ti may also be used as a second metal element. When the B site element of the conductive perovskite metal oxide film, such as an SrRuO$_3$ film, is a first metal element, the first and second metal elements may satisfy such a relation that the decrease of Gibbs free energy at a time when the second metal element forms an oxide is larger than that at a time when the first metal element forms an oxide. Concretely, as the second metal element, in addition to Ti, the use of V, W, Zr, Cr, Mg, Hf, Mo, Mn, Ta, or Nb is also possible.

Moreover, a PZT film (Pb(Zr$_x$Ti$_{1-x}$)O$_3$ film) is used as the dielectric film (ferroelectric film) in the first and second embodiments, but an SBT film (SrBi$_2$Ta$_2$O$_9$ film) may also be used. In general, it is possible to use a perovskite compound film or Bi aurivillius phase compound film. Furthermore, a high dielectric constant film may also be used as the dielectric film.

Furthermore, a tungsten plug is used as the plug in the first and second embodiments, but a polysilicon plug may also be used.

Additionally, the noble metal film, metal oxide film, and metal film are formed by a sputtering process in the first embodiment, but these may also be formed by a CVD or sol-gel process. Moreover, the noble metal film and metal oxide film are formed by a sputtering process in the second embodiment, but may also be formed by CVD or sol-gel process.

Furthermore, the techniques described in the first and second embodiments can be applied not only to an FeRAM, but also to a DRAM.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor device comprising:
a semiconductor substrate; and
a capacitor provided above the semiconductor substrate and comprising a bottom electrode, a top electrode, and a dielectric film provided between the bottom electrode and the top electrode,
at least one of the bottom electrode and the top electrode comprising:
a conductive film selected from a noble metal film and a noble metal oxide film;
a metal oxide film having a perovskite structure, provided between the dielectric film and the conductive film, represented by ABO$_3$, and containing a first metal element as a B site element; and
a metal film provided between the conductive film and the metal oxide film, and containing a second metal element which is a B site element of a metal oxide having a perovskite structure,
a decrease of Gibbs free energy at a time when the second metal element forms an oxide being larger than that at a time when the first metal element forms an oxide.

2. The semiconductor device according to claim 1, wherein the second metal element is selected from Ti, V, W, Zr, Cr, Mg, Hf, Mo, Mn, Ta, and Nb.

3. The semiconductor device according to claim 1, wherein the first metal element is selected from Ru, Co, and Ni.

4. The semiconductor device according to claim 1, wherein the metal oxide film contains at least one of Ru, Co, and Ni.

5. The semiconductor device according to claim 1, wherein the conductive film is selected from an iridium film, an iridium oxide film, a ruthenium film, a ruthenium oxide film, and a platinum film.

6. The semiconductor device according to claim 1, wherein the dielectric film is selected from a perovskite compound film and a Bi aurivillius phase compound film.

7. The semiconductor device according to claim 6, wherein the dielectric film is a ferroelectric film.

8. The semiconductor device according to claim 1, wherein the dielectric film contains Pb.

9. The semiconductor device according to claim 1, further comprising an intermediate region provided between the semiconductor substrate and the capacitor, the intermediate region including a plug connected to the bottom electrode.

10. The semiconductor device according to claim 9, further comprising a transistor provided on the semiconductor substrate and connected to the plug.

11. The semiconductor device according to claim 1, wherein at least one of the conductive film, the metal oxide film, and the metal film is formed by a sputtering process, a CVD process, or a sol-gel process.

12. A semiconductor device comprising:
a semiconductor substrate; and
a capacitor provided above the semiconductor substrate and comprising a bottom electrode, a top electrode, and a dielectric film provided between the bottom electrode and the top electrode,
at least one of the bottom electrode and the top electrode comprising:
a conductive film selected from a noble metal film and a noble metal oxide film; and
a metal oxide film having a perovskite structure, provided between the dielectric film and the conductive film, represented by ABO$_3$, and containing first and second metal elements as B site elements;
a decrease of Gibbs free energy at a time when the second metal element forms an oxide being larger than that at a time when the first metal element forms an oxide.

13. The semiconductor device according to claim 12, wherein the second metal element is selected from Ti, V, W, Zr, Cr, Mg, Hf, Mo, Mn, Ta, and Nb.

14. The semiconductor device according to claim 12, wherein the first metal element is selected from Ru, Co, and Ni.

15. The semiconductor device according to claim 12, wherein the metal oxide film contains at least one of Ru, Co, and Ni.

16. The semiconductor device according to claim 12, wherein the conductive film is selected from an iridium film, an iridium oxide film, a ruthenium film, a ruthenium oxide film, and a platinum film.

17. The semiconductor device according to claim 12, wherein the dielectric film is selected from a perovskite compound film and a Bi aurivillius phase compound film.

18. The semiconductor device according to claim 17, wherein the dielectric film is a ferroelectric film.

19. The semiconductor device according to claim 12, wherein the dielectric film contains Pb.

20. The semiconductor device according to claim 12, further comprising an intermediate region provided between the semiconductor substrate and the capacitor, the intermediate region including a plug connected to the bottom electrode.

21. The semiconductor device according to claim 20, further comprising a transistor provided on the semiconductor substrate and connected to the plug.

22. The semiconductor device according to claim 12, wherein at least one of the conductive film and metal oxide film is formed by a sputtering process, a CVD process, or a sol-gel process.

* * * * *